(12) United States Patent  
Malik et al.

(10) Patent No.: US 9,135,997 B2  
(45) Date of Patent: Sep. 15, 2015

(54) SYSTEM AND METHOD FOR FILTERING ADDRESSES

(71) Applicants: Yasir Malik, East Brunswick, NJ (US); Ali Zaringhalam, North Caldwell, NJ (US)

(72) Inventors: Yasir Malik, East Brunswick, NJ (US); Ali Zaringhalam, North Caldwell, NJ (US)

(73) Assignee: Fujitsu Limited, Kawasaki-shi (JP)

( * ) Notice: Subject to any disclaimer, the term of this patent is extended or adjusted under 35 U.S.C. 154(b) by 257 days.

(21) Appl. No.: 13/925,331

(22) Filed: Jun. 24, 2013

(65) Prior Publication Data

US 2014/0208016 A1 Jul. 24, 2014

Related U.S. Application Data

(60) Provisional application No. 61/754,386, filed on Jan. 18, 2013.

(51) Int. Cl.
| | |
|---|---|
| *G06F 12/00* | (2006.01) |
| *G11C 15/04* | (2006.01) |
| *H04L 12/741* | (2013.01) |
| *H04L 12/743* | (2013.01) |
| *H04L 29/12* | (2006.01) |

(52) U.S. Cl.  
CPC .......... *G11C 15/04* (2013.01); *H04L 29/12801* (2013.01); *H04L 45/745* (2013.01); *H04L 45/7457* (2013.01)

(58) Field of Classification Search  
CPC ..... G06F 12/00; G11C 15/04; H04L 45/7457; H04L 45/745; H04L 29/12801  
See application file for complete search history.

(56) References Cited

U.S. PATENT DOCUMENTS

| | | | | |
|---|---|---|---|---|
| 8,082,360 | B2 * | 12/2011 | Ogura | 709/232 |
| 2003/0056001 | A1 * | 3/2003 | Mate et al. | 709/238 |
| 2006/0120128 | A1 * | 6/2006 | Ogura | 365/49 |
| 2013/0329742 | A1 * | 12/2013 | Chinta et al. | 370/400 |

* cited by examiner

*Primary Examiner* — John Lane  
(74) *Attorney, Agent, or Firm* — Baker Botts L.L.P.

(57) ABSTRACT

A method includes determining addresses, determining masks, and storing the masks in a ternary content-addressable-memory for matching a candidate address to the masks to determine matches to the addresses. The addresses include an address width and positions, the address width equal to the number of positions. Each mask matches one or more addresses, includes a mask width equal to the address width, and includes matching criteria for determining whether to filter a given address. The matching criteria includes a matching component specifying that an identified position in the address includes a particular value or a wildcard component specifying that an identified position in the address is to be ignored. The masks include at least one mask with a wildcard component. The number of masks is less than the number of the addresses. The number of possible addresses corresponding to the masks is equal to the number of the addresses.

20 Claims, 7 Drawing Sheets

402 — VALUE FIELD = { 0001 1101 0001 1010 }
404 — MASK FIELD = { 1111 1111 1111 1000 }

MASK "1" → MUST MATCH VALUE FIELD
FIELD: "0" → IGNORED

MASK = { 0001 1101 0001 1XXX }  — 406

402 — VALUE FIELD = { 0001 1101 0001 1010 }
404 — MASK FIELD = { 1111 1111 1111 1000 }

INPUT x = { 0001 1101 0001 1011 } → MATCHES MASK PAIR
INPUT y = { 1001 1101 0001 1010 } → DOES NOT MATCH MASK PAIR

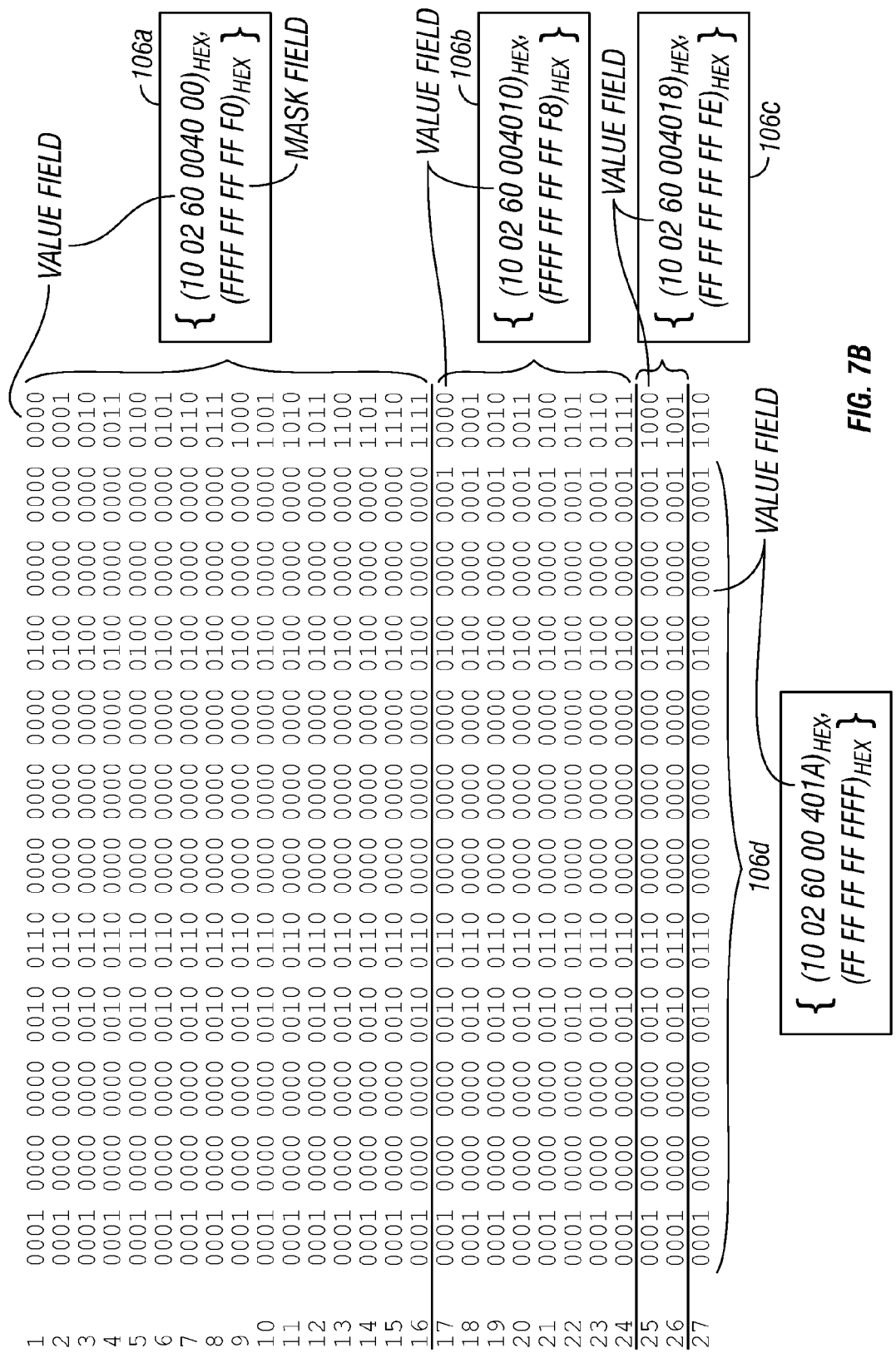

us 9,135,997 B2

SYSTEM AND METHOD FOR FILTERING ADDRESSES

RELATED APPLICATION

This application claims the benefit of U.S. Provisional Patent Application Ser. No. 61/754,386 filed Jan. 18, 2013, entitled "System and Method for Filtering Addresses" the contents of which is hereby incorporated by reference in its entirety.

TECHNICAL FIELD

The present disclosure relates generally to electronic communication and, more particularly, to a system and method for filtering addresses.

BACKGROUND

A communication network may include network elements that route packets and/or frames through the network. Some network elements may include a distributed architecture, wherein frame processing may be distributed among several subsystems of the network element (e.g., line cards, switches, and traffic managers). In some instances, a network element used in a communication network may be a multi-function Ethernet aggregation network element. A multi-function Ethernet aggregation network element may be one which supports many functions, including without limitation link aggregation, virtual LAN (VLAN) detection, and traffic management/shaping. Forwarding or routing packets may be performed based upon Media Access Control (MAC) addresses. MAC addresses may be stored in a table. Ternary content-addressable-memory (TCAM) may be used to store information for hardware processing of network elements.

SUMMARY

The object and advantages of the invention will be realized and attained by means of at least the features, elements, and combinations particularly pointed out in the claims.

In one embodiment, a method includes determining addresses. Each address is associated with a port of a network device and includes an address width and positions. Each position includes a numerical component. The address width is equal to a total number of positions. The method further includes determining masks. Each mask is configured to match one or more addresses and includes a mask width equal to the address width and matching criteria for determining whether a given address is to be filtered. The matching criteria includes, for each of the positions, a matching component specifying that an identified position in the address includes a particular value or a wildcard component specifying that an identified position in the address is to be ignored. The method further includes storing the masks in a ternary content-addressable-memory (TCAM) for matching a candidate address to the masks to determine whether the candidate address matches any of the addresses. The masks include at least one mask with a wildcard component. The total number of masks is less than the total number of the addresses. The total number of possible addresses corresponding to the masks is equal to a total number of the addresses.

In another embodiment, an article of manufacture includes a computer readable medium and computer-executable instructions carried on the computer readable medium. The instructions are readable by a processor. The instructions, when read and executed, cause the processor to determine addresses. Each address is associated with a port of a network device and includes an address width and positions. Each position includes a numerical component. The address width is equal to a total number of positions. The processor is further caused to determine masks. Each mask is configured to match one or more addresses and includes a mask width equal to the address width and matching criteria for determining whether a given address is to be filtered. The matching criteria includes, for each of the positions, a matching component specifying that an identified position in the address includes a particular value or a wildcard component specifying that an identified position in the address is to be ignored. The processor is further caused to store the masks in a TCAM for matching a candidate address to the masks to determine whether the candidate address matches any of the addresses. The masks include at least one mask with a wildcard component. The total number of masks is less than the total number of the addresses. The total number of possible addresses corresponding to the masks is equal to a total number of the addresses.

In yet another embodiment, an electronic device includes a processor, a computer readable medium, and computer-executable instructions carried on the computer readable medium. The instructions are readable by the processor. The instructions, when read and executed, cause the processor to determine addresses. Each address is associated with a port of a network device and includes an address width and positions. Each position includes a numerical component. The address width is equal to a total number of positions. The processor is further caused to determine masks. Each mask is configured to match one or more addresses and includes a mask width equal to the address width and matching criteria for determining whether a given address is to be filtered. The matching criteria includes, for each of the positions, a matching component specifying that an identified position in the address includes a particular value or a wildcard component specifying that an identified position in the address is to be ignored. The processor is further caused to store the masks in a TCAM for matching a candidate address to the masks to determine whether the candidate address matches any of the addresses. The masks include at least one mask with a wildcard component. The total number of masks is less than the total number of the addresses. The total number of possible addresses corresponding to the masks is equal to a total number of the addresses.

It is to be understood that both the foregoing general description and the following detailed description are exemplary and explanatory and are not restrictive of the invention, as claimed.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein:

FIG. 7B illustrates more detailed example operation of filtering addresses of communication data.

DETAILED DESCRIPTION

Figure 1:
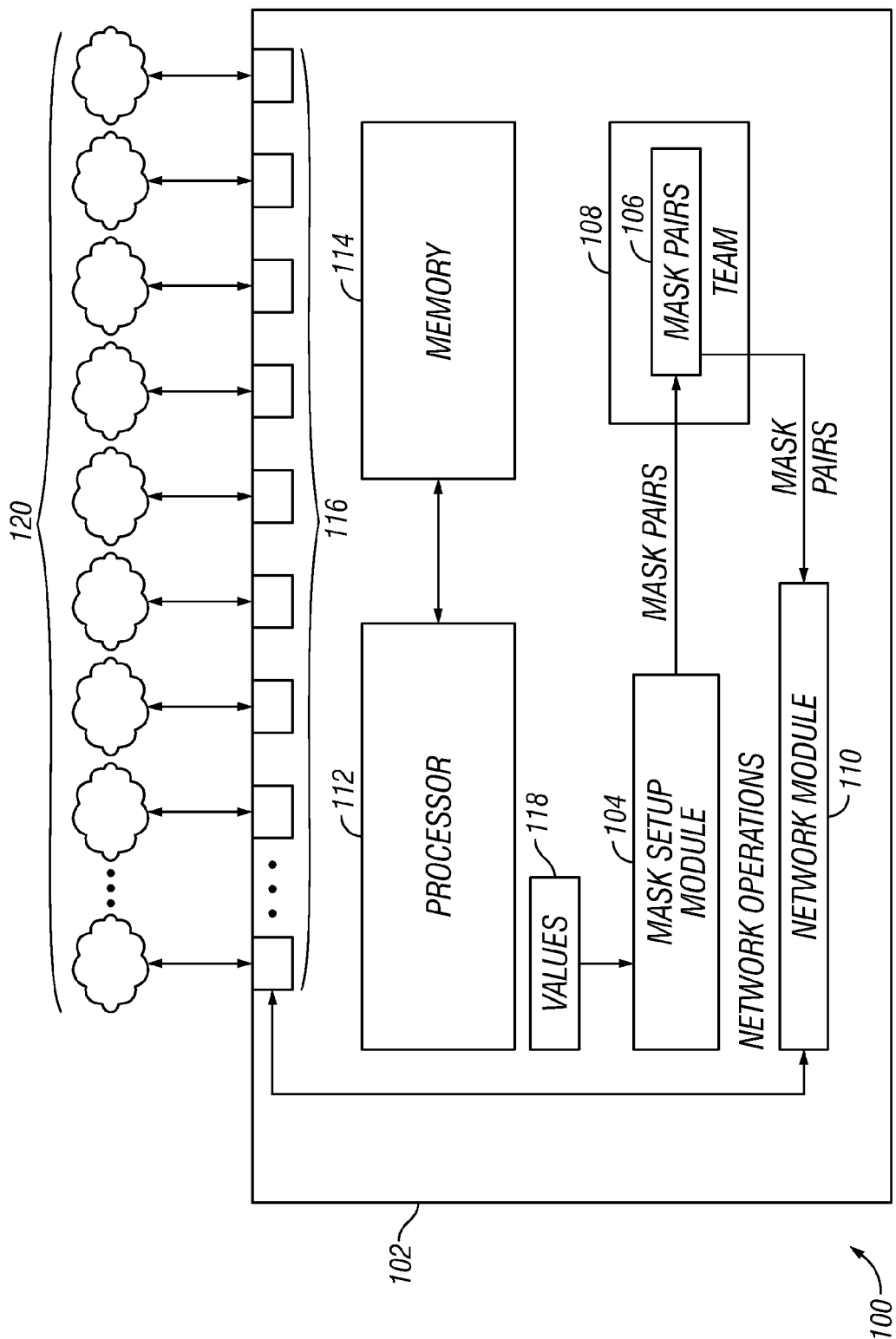
FIG. 1 illustrates an example embodiment of a system for filtering addresses of communication data.

FIG. 1 illustrates an example embodiment of a system 100 for filtering addresses of communication data. Such data may include, for example, frames, packets, segments, messages, datagrams, or protocol data units received or to be sent over electronic networks by a suitable electronic device. Such filtering may be performed, for example, for handling such data arriving from or addressed to particular destinations. For example, such filtering may be performed at an electronic device to determine whether data received is intended for the electronic device itself and should be sent to an appropriate portion of the electronic device, discarded, or whether data received is for another electronic device and should be forwarded to another destination. To perform filtering, system 100 may be configured to generate and employ one or more mask pairs 106. Mask pairs 106 may include information for system 100 to match addresses of data received or to be sent against specifications. Such specifications may include, for example, ranges of addresses that should be filtered for a given purpose. By generating and using mask pairs 106, system 100 may be configured to reduce the total information necessary to be generated and tracked for performing filter operations.

System 100 may include one or more electronic devices 102. Electronic device 102 may be configured to send and receive communication data. Electronic device 102 may include any number or kind of mechanisms for sending and receiving communication data, such as ports 116. Ports 116 may be implemented in any suitable manner, such as by a physical or virtual network port. The configuration of ports 116 may be made according to any suitable network protocol used by electronic device 102. Each of ports 116 may be communicatively coupled to a network destination. In the example of FIG. 1, each of ports 116 may be communicatively coupled to a network 120. Each of networks 120 may include one or more electronic devices and may be implemented in any suitable fashion, including by the Internet, an intranet, a local-area-network, a wide-area-network, metropolitan-area-network, peer-to-peer network, mesh network, ring network, token network, or any combination thereof.

Electronic device 102 may be configured to use any suitable network protocol, such as, for example, Transfer Control Protocol/Internet Protocol (TCP/IP), Fibre Channel, Hyper Text Transfer Protocol (HTTP), File Transfer Protocol (FTP), Telnet, User Datagram Protocol (UDP), Open Systems Interconnection (OSI) protocols, Multiprotocol Label Switching (MPLS), or protocols using EtherType. Accordingly, ports 116 and networks 120 may be configured to also use any such suitable network protocol.

Furthermore, electronic device 102 may be configured to send and receive data using any suitable addressing method according to a suitable network protocol. For example, data may be sent and received by electronic device 102 using TCP/IP addresses, Media Access Control (MAC) addresses, Virtual Large Area Network (VLAN) identifiers, Layer-3 (L3) addresses, Layer-4 (L4) addresses, EtherType addresses, or MPLS labels. Such addressing methods may be used by the data—such as packets, frames, or messages—sent and received by electronic device 102. In one embodiment, electronic device 102 may be configured to perform filtering on data sent and received by electronic device 102 on the basis of addresses within such data.

Electronic device 102 may include information for one or more addresses with which filtering may be performed. Such addresses may include, for example, addresses assigned to electronic device 102 or portions thereof, or addresses for a device or network for which electronic device 102 provides network management. Electronic device 102 may store such information in values 118. Values 118 may be assigned by, for example, a manufacturer of electronic device 102, firmware of electronic device 102, a component included on electronic device 102, or by one or more applications, modules, or other entities operating on electronic device 102 such as network module 110. In one embodiment, values 118 may correspond to addresses of electronic device 102. Such network addresses may include IP addresses or MAC addresses for each of ports 116. In a further embodiment, values 118 may be set by a manufacturer of electronic device 102. In another further embodiment, values 118 may be set upon boot-up of electronic device 102 or an initialization of an IP stack on electronic device 102.

In one embodiment, electronic device 102 may be configured to create one or more entities by which filtering may be performed. Such entities may include one or more mask pairs 106. In another embodiment, electronic device 102 may be configured to receive such entities from another electronic device. In such an embodiment, the electronic device generating such entities may be configured in the same manner as described below for configuring electronic device 102 for creating such entities. In order to create one or more entities by which filtering may be performed, such as mask pairs 106, electronic device 102 may include a mask setup module 104.

Mask setup module 104 may be configured to determine information on which filtering should be performed, such as addresses included in values 118, and create one or more mask pairs 106 by which electronic device 102 may filter data sent or received. The total number of mask pairs 106 may be less than the number of addresses which are to be filtered according to values 118. Accordingly, use of mask pairs 106 for filtering may use less memory space than simply filtering based upon the full list of addresses detailed in values 118.

Each of mask pairs 106 may be implemented in any suitable manner. Mask pairs 106 may include an indication of a base value which must be matched at least in part. Accordingly, use of a mask pair 106 may facilitate filtering based upon such a base value. Furthermore, mask pairs 106 may include one or more masks, wildcards, or other indicators of portions of the base value which do not need to be matched for a filtering operation. Although labeled as a pair, mask pairs 106 may be implemented by one, two, or any suitable combination of indicators that may be used by electronic device 102 for filtering. For example, in one embodiment each of mask pairs 106 may include an integer corresponding to a base address for which data is being filtered. The base value may have a certain bit length. Furthermore, each of mask pairs 106 may include a second integer of the same bit length defining which bits or portions of the base address must be the same as corresponding bits or portions of candidate data and which bits or portions of the base address are not required to be the same as corresponding bits or portions of candidate data. Mask pairs 106 may be stored in an array, table, or other suitable structure.

Mask setup module 104 may be configured to generate mask pairs 106 from values 118 and store them in any suitable portion of electronic device 102. In one embodiment, mask pairs 106 may be stored in content-addressable-memory. In a further embodiment, mask pairs 106 may be stored in ternary content-addressable-memory (TCAM) 108. TCAM 108 may include data search words with three possible states: zero, one, and "X". The state "X" may be equivalent to a "don't care" state or to a wildcard. TCAM 108 may be configured to provide fast searching of its contents for entities of electronic device 102. Mask pairs 106, as stored within TCAM 108, may be implemented such that the elements of the base address that must match candidate data are implemented according to the "zero" or "one" value of the base address, and such that elements of the base address that are not required to match candidate data are implemented with an "X" state. Multiple entries in TCAM 108 may be searched in parallel. The result of such a search may include an output of all the entries that match the input. TCAM 108 may be implemented in, for example, an Application-Specific Integrated Circuit (ASIC), processor such as a networking processor, module, board, or other suitable portion of electronic device 102. The resources, such as memory space, available for TCAM 108 may be limited. Thus, electronic device 102 may be configured to minimize the entries in TCAM 108. Electronic device 102 may be configured to access TCAM 108 to access mask pairs 106 to perform filtering functions on data to be received or sent.

Mask setup module 104 may be configured to generate mask pairs 106 at any suitable time. For example, mask setup module 104 may be configured to generate mask pairs 106 upon boot-up of electronic device 102, upon request from an entity within electronic device 102 such as network module 110, periodically, upon a pre-determined event, or upon initialization of a network stack or configuration in electronic device 102.

Electronic device 102 may include any suitable number or kind of entities configured to perform network operations and use filtering, such as network module 110. Network module 110 may be implemented by, for example, a network processor, ASIC, function, code, library, script, application, program, module, board, or any combination thereof. For example, network module 110 may handle the processing of inbound data—such as packets, frames, or messages—and determine whether such data should be kept or forwarded based upon the addresses contained therein and whether such addresses match those defined in mask pairs 106.

Electronic device 102 may include a processor 112 communicatively coupled to a memory 114. Portions of electronic device 102, such as mask setup module 104 or network module 110, may include instructions in memory 114 for execution by processor 112. Processor 112 may include, for example a microprocessor, microcontroller, digital signal processor (DSP), ASIC, or any other digital or analog circuitry configured to interpret and/or execute program instructions and/or process data. Memory 114 may be configured in part or whole as application memory, system memory, firmware, on-chip memory, or a combination thereof. Memory 114 may include any system, device, or apparatus configured to hold and/or house one or more memory modules. Each memory module may include any system, device or apparatus configured to retain program instructions and/or data for a period of time (e.g., computer-readable media).

Values 118 may be implemented in any suitable manner, such as by a list, record, file, data structure, or other suitable entity. Values 118 may reside in, for example, memory 114

Mask setup module 104 may be implemented in any suitable manner, such as by a program, application, script, function, library, code, device, card, module, electronic hardware, or any combination thereof.

Electronic device 102 may be implemented by any suitable entity, such as by a computer, server, router, switch, card, board, or controller.

Figure 2:
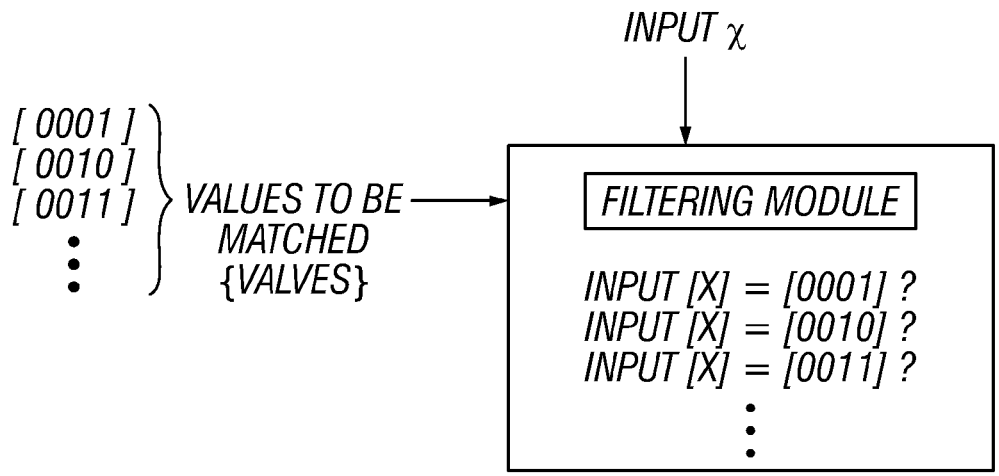
FIG. 2 illustrates operation of an electronic device conducting filtering operations without the use of mask pairs.

FIG. 2 illustrates operation of an electronic device conducting filtering operations without the use of mask pairs 106 or other such entities. Given a set of values to be matched such as {values}—which may include addresses to be filtered— and given and input x—wherein x may be an address of data received or to be sent—a filtering module may attempt to determine whether x is defined within the set {values} such that x should be filtered. If the set {values} is ordered and addressable, the filtering module may be able to search for x using, for example, a heap search, bubble search, or binary search. However, {values} must include an entry for each and every value for which an input x is to be filtered. Furthermore, even if relatively efficient searches of the set {values} are available, the processing cost of searching such a set may increase accordingly with the size of the set. Thus, the larger set may cause increasingly expensive searches.

Figure 3:
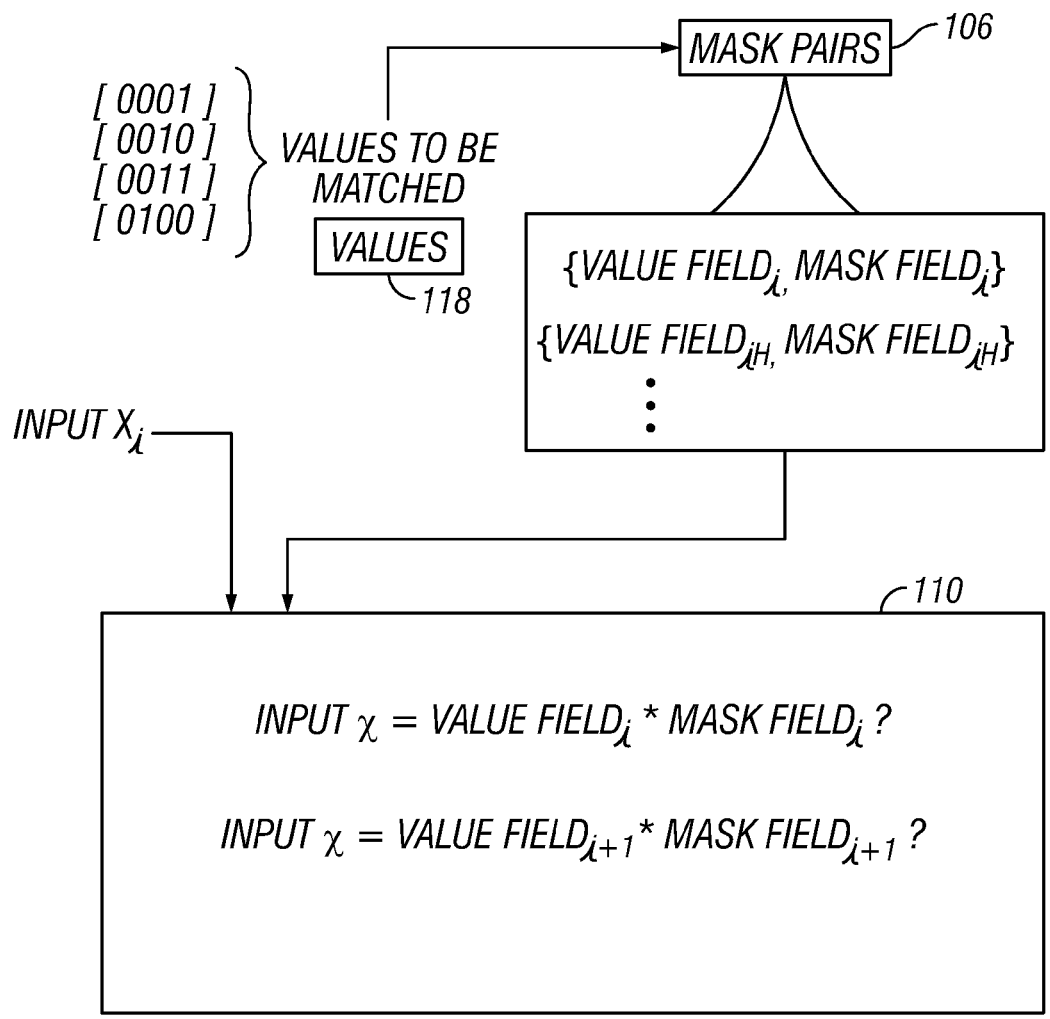
FIG. 3 illustrates example operation of an electronic device conducting filtering operations using masking.

FIG. 3 illustrates example operation of an electronic device conducting filtering operations using masking, such as with mask pairs 106. Given a set of values to be matched as specified in values 118, one or more mask pairs 106 may be generated. Each such mask pair 106 may include, for example, a value field and a mask field. The value field may indicate a base value, which may include an address, which is to be matched against input to be filtered. The mask field may indicate which portions or bits of the value field must be matched precisely, and which portions or bits of the value field may be ignored. The number of mask pairs 106 encapsulating the specified values 118 may be less than the number of elements in values 118.

Thus, given mask pairs 106 and input x, wherein x may be an address of data received or to be sent, network module 110 (or another suitable portion of electronic device 102) may attempt to determine whether x is defined within the mask pairs 106 such that x should be filtered. In one embodiment, a given mask pair 106 may be evaluated by applying the mask value to the base value and comparing the result with the input x. An input x matching the criteria of one or more mask pairs 106 may thus be kept, and an input x not matching the criteria of any of mask pairs 106 may be filtered out.

Figure 4:
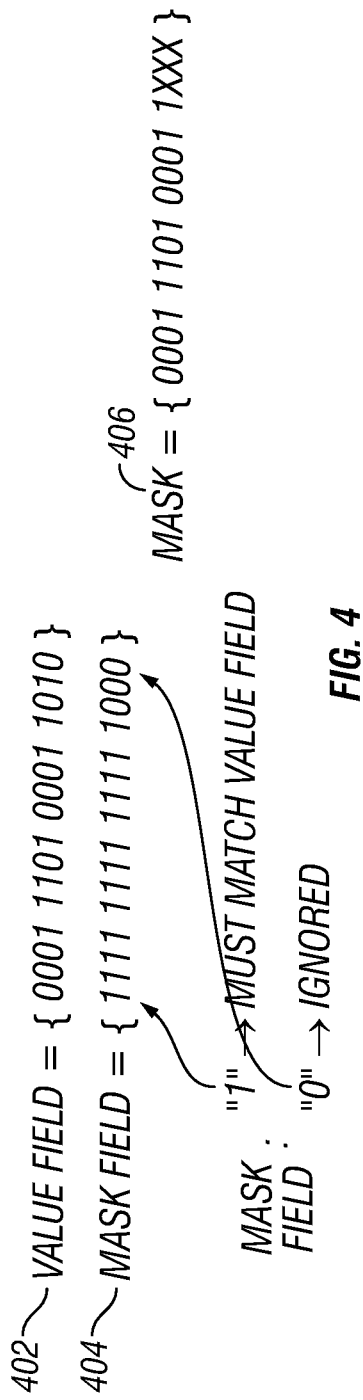
FIG. 4 is an illustration of a possible implementation of mask pairs.

FIG. 4 is an illustration of a possible implementation of mask pairs 106. A value field 402 may include, for example, a value representing an address of a specified length or width of bits. In one embodiment, a corresponding mask field 404 may include an equal length or width of bits. Mask field 404 may include a "one" wherein a bit of an input must exactly match the corresponding bit of value field 402. Furthermore, mask field 404 may include a "zero" wherein a bit of an input may be ignored as to whether it is equal to the corresponding bit of value field 402. In another embodiment, a mask 106 may be implemented with a "zero" or "one" indicating a requirement that an input bit be a "zero" or "one" (which matches the corresponding "zero" or "one" of a base adders), and an "X" or other wildcard wherein an input bit may be ignored.

Thus, in the example of FIG. 4, value field 402 may include the binary numbers {0000 1101 0001 1010} indicating a base address which may be matched for the purposes of filtering. Mask field 404 may include the binary numbers {1111 1111 1111 1000} indicating that a given input may be ignored with respect to the least significant three bits and must match the next thirteen most significant bits of value field 402. Furthermore, mask 406 may include the set of indicators {0001 1101 0001 1XXX} indicating that a given input may be ignored with respect to the least significant three bits and that the next thirteen most significant bits must include {0001 1101 0001 1}. Mask 406 may be functionally equivalent to the combination of value field 402 and mask field 404 as presented in FIG. 4.

Figure 5:
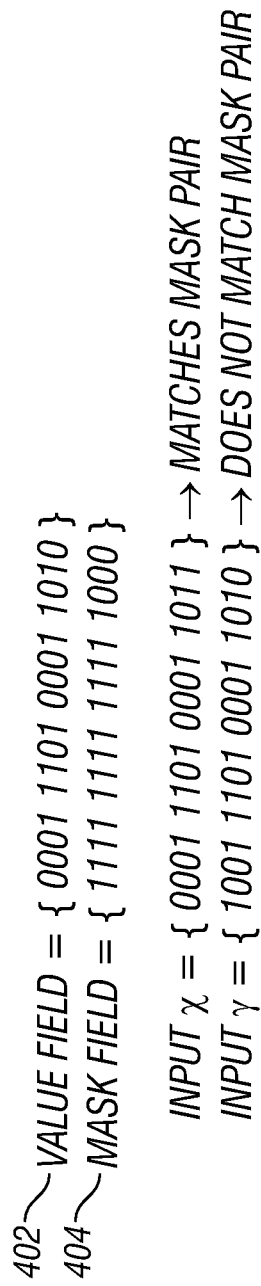
FIG. 5 is an illustration of filtering of a given input by mask pairs.

FIG. 5 is an illustration of filtering of a given input x or input y by mask pairs 106. Given value field 402 including {0001 1101 0001 1010} and mask field 404 including {1111 1111 1111 1000}, any input may be ignored with respects to bits [0 . . . 2] and must be equal to {0001 1101 0001 1} with respect to bits [3 . . . 15].

Thus, given input x including {0001 1101 0001 1011} may match mask field 404 as applied to value field 402 because input x is identical to value field 402 with respect to bits [3 . . . 15]. The difference between input x and value field 402 with respect to bit [0] may be ignored.

Furthermore, given input y including {1000 1101 0001 1010} may not match mask field 404 as applied to value 402 because input y does not match value field 402 with respect to bit [15]. Thus, input y may be filtered out and thus ignored.

Returning to FIG. 1, mask setup module 104 may be configured to create mask pairs 106 based upon values 118 in any suitable manner. Mask setup module 104 may be configured to analyze values 118 to determine whether values 118 may be represented by a single mask pair 106 that encapsulates the contents of values 118. Furthermore, mask setup module 104 may be configured to analyze values 118 to determine whether such a single mask pair 106 may include only elements from values 118. If a given mask pair 106 matches elements not within values 118, then the mask pair 106 may be unacceptable, as inputs not matching the requirements of values 118 may be included in the filtered results.

If mask setup module 104 can determine a single mask pair that includes all elements of values 118 and only elements of values 118, then the single mask pair 106 may be included in mask pairs 106. If mask setup module 104 cannot determine a single mask pair that includes all elements of values 118 and only elements of values 118, then mask setup module 104 may be configured to determine a combination of multiple mask pairs 106 that collectively include all elements of values 118 and only elements of values 118. To determine such a combination of multiple mask pairs 106, mask setup module 104 may be configured to determine the largest subset of values 118 that may be included in a single mask pair—which may only include elements from values 118. Mask setup module 104 may be configured to add such a single mask pair to mask pairs 106 and then determine the largest subset of the remaining elements of values 118 that may be included in a single mask pair—which may only include elements from values 118. Mask setup module 104 may be configured to add such a single mask pair to mask pairs. Furthermore, mask setup module 104 may be configured to repeat determining the largest subset of the remaining elements of values 118 that may be included in a single mask pair (while only including elements from values 118) until all of values 118 are accounted for by one of mask pairs 108.

Mask setup module 104 may be configured to iteratively or recursively determine mask pairs 106 in any suitable manner. In one embodiment, mask setup module 104 may be configured to determine mask pairs 106 sequentially by addresses within values 118. Thus, given an ordered set of elements in values 118, mask setup module 104 may be configured to determine a first mask pair 106 encapsulating as many possible elements of values 118 (and only elements of values 118) beginning at the first element. If necessary, mask setup module 104 may be configured to determine a second mask pair 106 encapsulating as many possible elements of values 118 (and only elements of values 118) beginning at the first element past the coverage of the previous mask pair 106. Mask setup module 104 may be configured to repeat determinations of mask pairs 106 that may include as many possible elements of values 118 (and only elements of values 118) at the first element past the coverage of a previous mask pair 106 until all elements of values 118 are associated with a corresponding mask pair 106. Subsequently, all such mask pairs 106 may be stored within, for example, TCAM 108 for use by other entities on electronic device 102.

In one embodiment, electronic device 102 may include a plurality of addresses (such as MAC addresses) corresponding to ports 116 that are consecutively ordered. Such a sequential ordering of MAC addresses may be accomplished by, for example, a manufacturer of electronic device 102 or ports 116, or by network provisioning of electronic device 102. Before the operation of mask setup module 104, the total number of addresses may be known. However, the starting point may not be known.

Mask setup module 104 may be configured to sequentially determine mask pairs 106 in any suitable manner. For example, given a starting address within values 108, mask setup module 104 may be configured to determine the number of leading zeroes Z beginning at the least significant bit (LSB) running towards the most significant bit (MSB) of the address. The first address, representing the lowest address, may be initially used from values 108 if values 108 are ordered. Further, $2^Z$ may represent the number of addresses that may be qualified with a single mask at the Z position. Mask setup module 104 may determine whether $2^Z$ is greater than the number of addresses unassigned to a mask pair 106. If $(2^Z)$ is greater than the number of unassigned addresses, then Z may be decremented until $(2^Z)$ is less than the number of unassigned addresses. In another example, a starting address may be determined by counting the number of leading zeros until $(2^Z)$ is greater than the total number of addresses to be matched.

A value field of a first mask pair 106 may be assigned to the presently considered address. If the effective number of zeroes Z is itself zero, then the largest number of elements of values 108 (that only includes elements of values 108) that may be covered with a single mask pair 106 may be a single element. Consequently, a mask field of a first mask pair 106 may include all "ones" or otherwise indicate that the presently considered address must be matched exactly. Otherwise, if the effective number of zeroes Z is itself greater than one then a mask field of a first mask pair include "zeroes" for the Z least-significant bits, and "ones" for the remaining bits. After the first mask pair is determined, $2^Z$ may be added to the presently considered address and $2^Z$ may be subtracted from the number of addresses yet to be assigned. If there are any addresses remaining, mask setup module 104 may be configured to repeat such steps, beginning with determining the number of leading zeroes Z beginning at the least significant bit of the newly determined address, until no addresses lack assignment to a mask pair.

Figure 6:
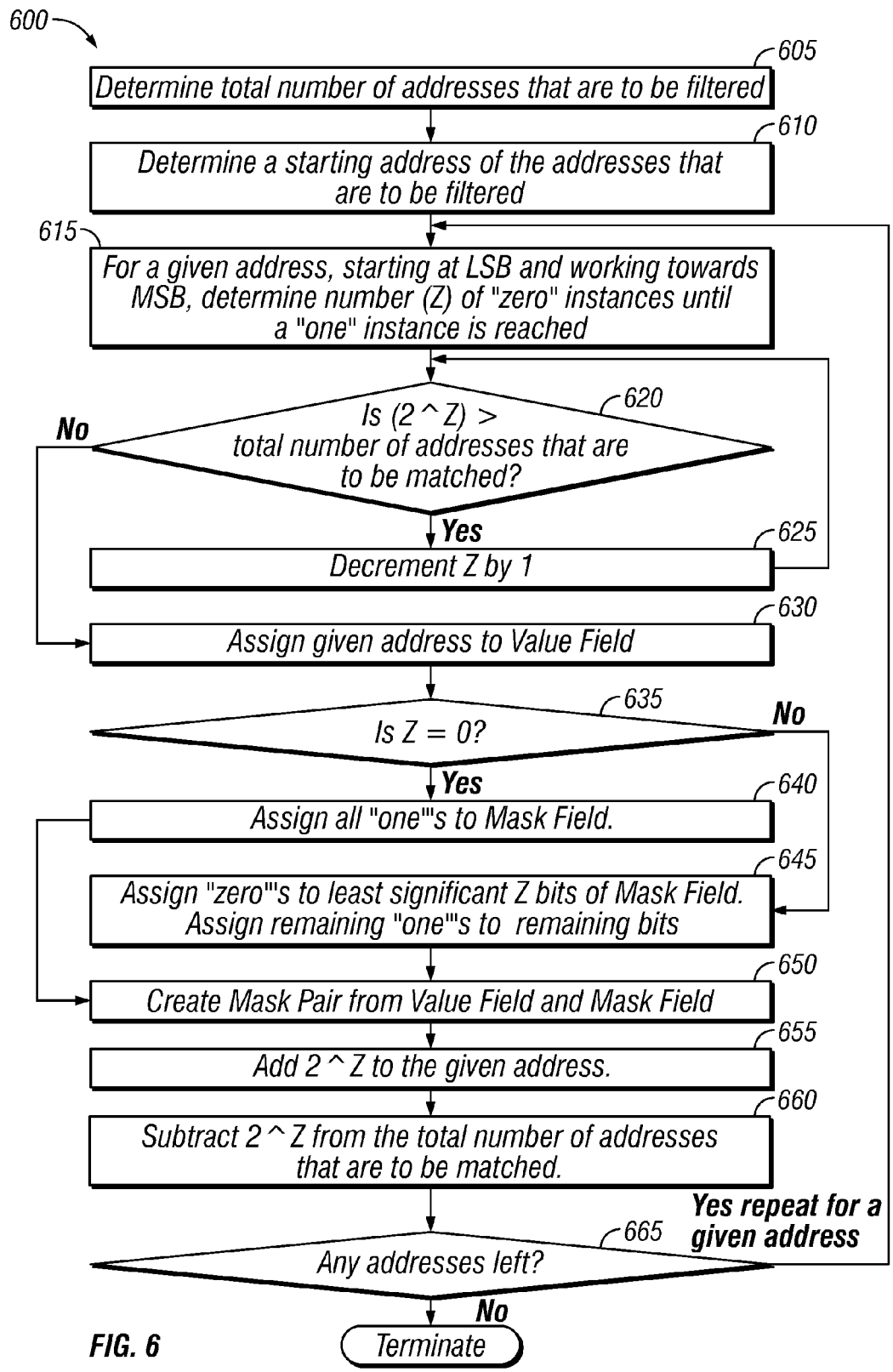
FIG. 6 illustrates an example method for determining mask pairs.

FIG. 6 illustrates an example method 600 for determining mask pairs. Method 600 may be implemented by any suitable mechanism, such as by mask setup module 104. The operation of mask setup module 104 to create mask pairs 106 may be illustrated fully or in part by method 600. At 605, a total number of values, such as addresses, to be filtered may be determined. At 610, a starting value, such as an address, of the values to be filtered may be determined.

At 615, for a given address (initially, the value determined at 610), the number of leading zeroes beginning at the LSB. Such a number of leading zeroes may be denoted as Z and may be determined in any suitable manner. The number of leading zeroes may be determined by counting the number of zeroes beginning at the LSB and running towards the MSB until a value of one is reached. The number of leading zeroes may be determined, for example, by bitwise comparisons of the address. In another example, the number of leading zeroes may be determined by iteratively dividing the address by progressive powers of two and evaluating the remainder.

The number of addressable values available for Z may be specified as $(2^Z)$. At 620, it may be determined whether the total number of addressable values $(2^Z)$ is greater than the total number of addresses that are to be matched or filtered. Such a total number of addresses may have been determined, for example, at 605 or in a previous execution of 660. If the total number of addressable values is greater than the total number of address to be filtered (for which a mask pair has not been created), then use of Z bits for masking would match elements not intended to be filtered. Thus, if the total number of addressable values is greater than the total number of addresses to be filtered (for which a mask pair has not been created) then method 600 may proceed to 625. If the total number of addressable values is less than or equal to the total number of addresses to be filtered (for which a mask pair has not been created) then method 600 may proceed to 630.

At 625, the effective number of leading zeroes Z for the address may be decremented. Then, method 600 may proceed to 620 to repeat 620.

At 630, a value field of a mask pair to be generated may be set to the given address presently considered. Such a value field may form the basis to which a mask field is applied and an input is subsequently compared.

At 635, if may be determined whether Z is itself equal to zero. Such a condition may indicate that the mask pair to be generated is to match a single address—the presently considered address. Accordingly, if Z is itself equal to zero at 640 the mask field of the mask pair may be set to require an exact match to the value field. Such a mask field may be denoted, for example, by setting all binary numbers of the mask field to ones.

If Z is itself not equal to zero, at 645 the mask field of the mask pair may be set to ignore the least significant Z bits and to exactly match the value field on the remaining bits. Such a mask field may be denoted, for example, by setting the least significant Z bits to zeroes and the remaining bits to ones. Such a mask field may be created by, for example, performing an AND operation between a set of all ones and an inverse of the bit representation of $(2^Z-1)$.

At 650, a mask pair may be generated from the mask field and the value field. Such a mask field and value field may remain separate sets or combined into a single structure. The mask pair may be added to any other mask pairs previously generated for the addresses determined at 605.

At 655, the presently considered address may be incremented by the amount of addresses for which a mask was created. For example, the number $(2^Z)$ may be added to the presently considered address.

At 660, the number of addresses for which a mask pair has not been generated may be decreased by the amount for which a mask was created. For example, the number of addresses may be subtracted by the number $(2^Z)$.

At 665, it may be determined whether any addresses remain for which a mask pair has not been generated. If so, method 600 may proceed to 615 to generate one or more additional mask pairs using the newly computed address and the newly computer number of addresses. If no addresses remain, method 600 may terminate.

Figure 7A:
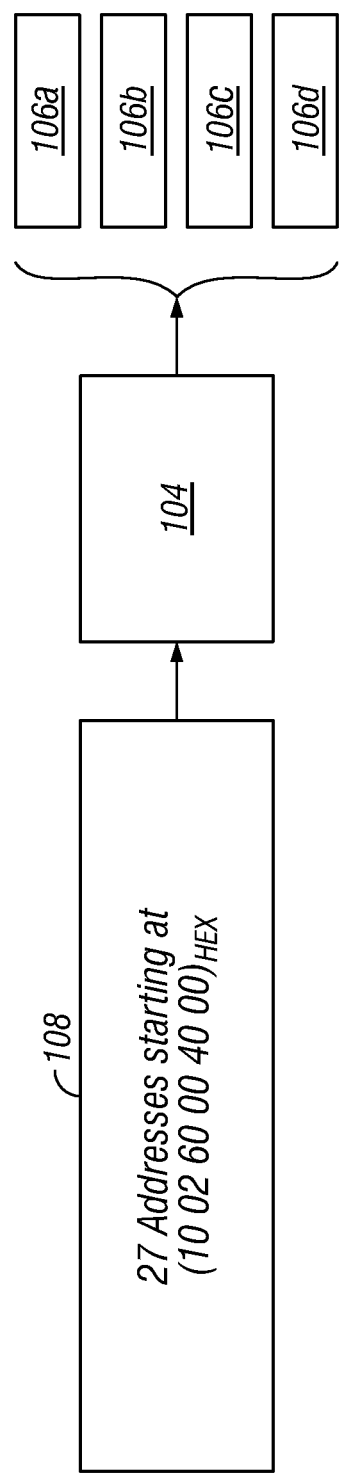
FIG. 7A illustrates example operation of filtering addresses of communication data.

FIG. 7A illustrates example operation of system 100 and/or method 600. Given values 108 including, for example, twenty-seven consecutive addresses beginning at the address (specified in hexadecimal notation) {10 02 60 00 40 00}, mask setup module 104 may produce four mask pairs 106a, 106b, 106c, 106d. FIG. 7B illustrates more detailed example operation of system 100, including consecutive addresses as they may be filtered by 106a, 106b, 106c, and 106d.

Beginning at the address {10 02 60 00 40 00} (HEX) or {0001 0000 0000 0010 0110 0000 0000 0000 0100 0000 0000 0000} (binary), mask setup module 104 may determine that the address includes fourteen leading zeroes (Z) beginning at its LSB. However, such a mask with fourteen bits would cover $(2^{14})$ addresses, or 16,834 addresses, which is more than the known number—twenty-seven—of addresses to be filtered for which mask pairs have not been determined. Z may be decremented until the number $(2^Z)$ is less than or equal to twenty-seven. Thus, Z may be decremented until Z is equal to four. By selecting Z=four, a total of sixteen $(2^Z=2^4=16)$ addresses may be filtered with a first mask pair 106a. The least significant four bits of the address may be masked with a wildcard, a zero, or otherwise denoted to be ignored, while the remaining bits may be masked with a one or otherwise denoted as requiring a match to the corresponding bit on the value field. The resulting mask field may be thus specified as {1111 1111 1111 1111 1111 1111 1111 1111 1111 1111 1111 0000} (binary) or {FF FF FF FF FF F0} (HEX). Thus, mask pair 106a may include {(10 02 60 00 40 00), (FF FF FF FF FF F0)} (HEX).

The value field may be incremented by the total number of masked elements from mask pair 106a. For example, sixteen $(2^Z=2^4=16)$ may be added to the original base address. The resulting new address may thus include {0001 0000 0000 0010 0110 0000 0000 0000 0100 0000 0001 0000} (binary) or {10 02 60 00 40 10} (HEX). The total number of addresses for which a mask pair has been created may be decreased by the total number of masked elements from mask pair 106a. For example, sixteen may be subtracted from the previous total, twenty-seven, such that eleven addresses—beginning at the new address—require mask pairs.

Mask setup module 104 may determine that the new address include {0001 0000 0000 0010 0110 0000 0000 0000 0100 0000 0001 0000} includes four leading zeroes (Z) at its LSB. However, such a mask with four bits would cover $(2^4)$ addresses, or sixteen addresses, which is more than the known number—eleven—of addresses to be filtered for which mask pairs have not been determined. Z may be decremented until the number $(2^Z)$ is less than or equal to eleven. Thus, Z may be decremented until Z is equal to three. By selecting Z=three, a total of eight $(2^Z=2^3=8)$ addresses may be filtered with a second mask pair 106b. The least significant three bits of the address may be masked with a wildcard, a zero, or otherwise denoted to be ignored, while the remaining bits may be masked with a one or otherwise denoted as requiring a match to the corresponding bit on the value field. The resulting mask field may be thus specified as {1111 1111 1111 1111 1111 1111 1111 1111 1111 1111 1111 1000} (binary) or {FF FF FF FF FF F8} (HEX). Thus, mask pair 106b may include {(10 02 60 00 40 10), (FF FF FF FF FF F8)} (HEX).

The value field may be incremented by the total number of masked elements from mask pair 106b. For example, eight $(2^Z=2^3=8)$ may be added to the existing base address. The resulting new address may thus include {0001 0000 0000 0010 0110 0000 0000 0000 0100 0000 0001 1000} (binary) or {10 02 60 00 40 18} (HEX). The total number of addresses for which a mask pair has been created may be decreased by the total number of masked elements from mask pair 106b. For example, eight may be subtracted from the previous total, eleven, such that three addresses—beginning at the new address—require mask pairs.

Mask setup module 104 may determine that the new address of {0001 0000 0000 0010 0110 0000 0000 0000 0100 0000 0001 1000} includes three leading zeroes (Z) at its LSB. However, such a mask with three bits would cover ($2^3$) addresses, or eight addresses, which is more than the known number—three—of addresses to be filtered for which mask pairs have not been determined. Z may be decremented until the number ($2^Z$) is less than or equal to three. Thus, Z may be decremented until Z is equal to one. By selecting Z=one, a total of two ($2^Z=2^1=2$) addresses may be filtered with a third mask pair 106c. The least bit of the address may be masked with a wildcard, a zero, or otherwise denoted to be ignored, while the remaining bits may be masked with a one or otherwise denoted as requiring a match to the corresponding bit on the value field. The resulting mask field may be thus specified as {1111 1111 1111 1111 1111 1111 1111 1111 1111 1111 1111 1110} (binary) or {FF FF FF FF FF FE} (HEX). Thus, mask pair 106c may include {(10 02 60 00 40 18), (FF FF FF FF FF FE)} (HEX).

The value field may be incremented by the total number of masked elements from mask pair 106c. For example, two ($2^Z=2^1=2$) may be added to the existing base address. The resulting new address may thus include {0001 0000 0000 0010 0110 0000 0000 0000 0100 0000 0001 1010} (binary) or {10 02 60 00 40 1A} (HEX). The total number of addresses for which a mask pair has been created may be decreased by the total number of masked elements from mask pair 106c. For example, two may be subtracted from the previous total, three, such that a single address—the new address—requires a mask pair.

Mask setup module 104 may determine that the new address of {0001 0000 0000 0010 0110 0000 0000 0000 0100 0000 0001 1010} includes a leading zero (Z) at its LSB; however, since $2^1$ is greater than the number of addresses left, Z may be reduced to 0, leaving an exact match. Consequently, mask setup module 104 may specify that all bits of the address may be masked with a one or otherwise denoted as requiring a match to the corresponding bit on the value field. The resulting mask field may be thus specified as {1111 1111 1111 1111 1111 1111 1111 1111 1111 1111 1111 1111} (binary) or {FF FF FF FF FF FF} (HEX). Thus, mask pair 106d may include {(10 02 60 00 40 1A), (FF FF FF FF FF FF)} (HEX).

Thus, if data including any of the addresses illustrated in FIG. 7B are received or are to be sent by electronic device 102, such data may match one of mask pairs 106a, 106b, 106c, 106d and be thus filtered. Upon such a filtering operation, an appropriate designated operation may be performed upon the data in question.

In various embodiments, system 100 may be configured to filter values or addresses that are not in sequential order. In one embodiment, a mask pair 106 may be generated for each of one or more of values 118 that are not in sequential order. To the extent that other of values 118 are in sequential order, mask pairs 106 such a portion of values 118 may be generated according to the system and method as described above in FIG. 1-7.

In another embodiment, mask pairs 106 may be generated for values 118 not in sequential order to the extent that such values 118 share a common number or combination of leading zeroes or ones that, if removed, would cause values 118 to be sequentially ordered. For example, give the hex values of {0000, 1000, 2000, and 3000} corresponding to the binary values of {(0000 0000 0000 0000), (0001 0000 0000 0000), (0010 0000 0000 0000), (0011 0000 0000 0000)}, such addresses would be sequential if the twelve least significant bits were removed. Mask pairs 106 may be generated for the resulting values according to the system and method as described above in FIG. 1-7. The twelve least significant bits may be added back to such resulting mask pairs 106. Such bits that may be returned to the resulting mask pairs 106 may be designated as requiring that matching input be equal to the returned bits.

Figure 8:
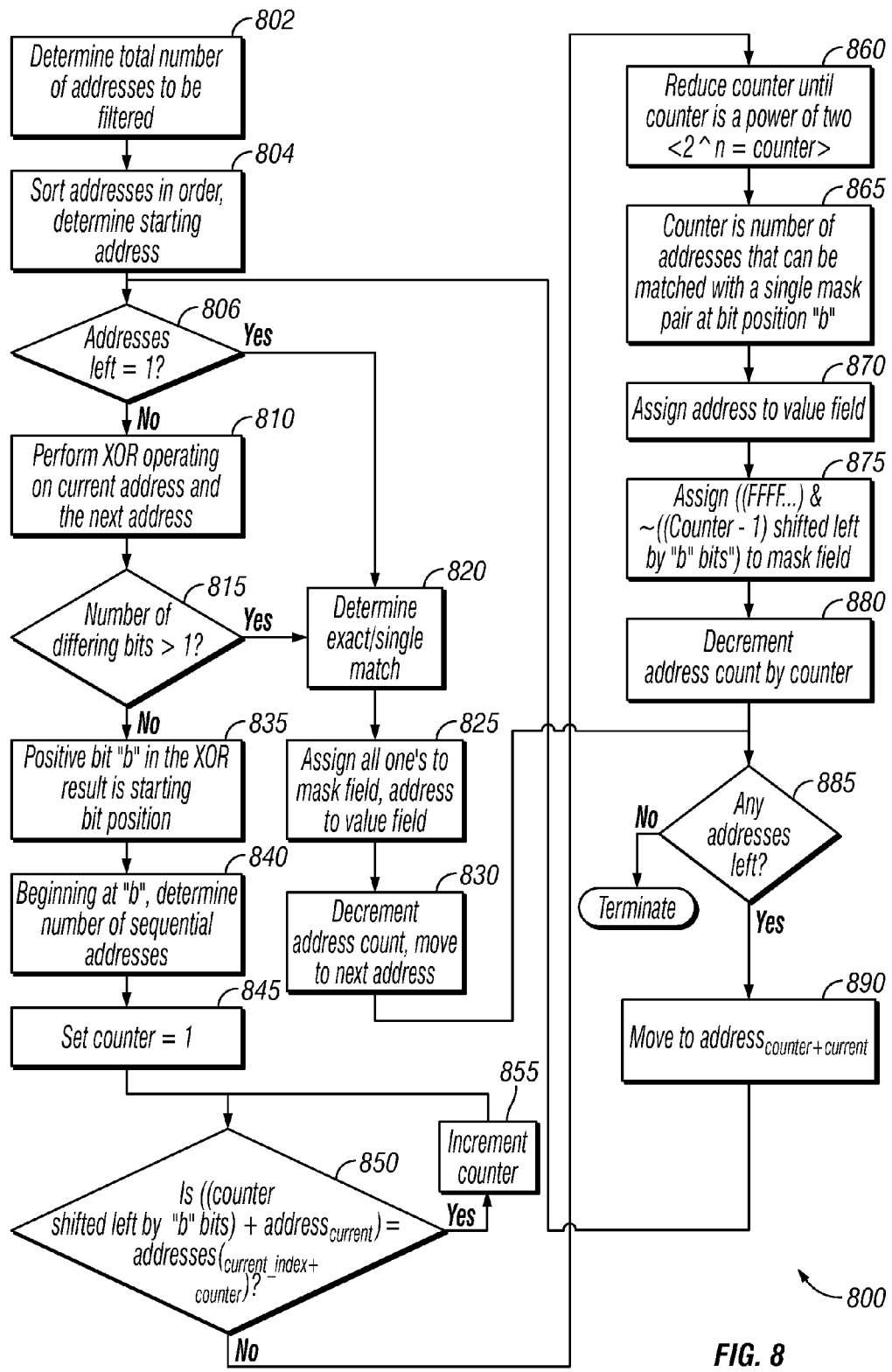
FIG. 8 illustrates an example embodiment of a method for determining mask pairs for sequential or non-sequential values.

Any suitable mechanism or method may be used to determine mask pairs 106 for values that are not in sequential order. FIG. 8 illustrates an example embodiment of a method 800 for determining mask pairs for sequential or non-sequential values. Method 800 may be implemented by any suitable mechanism, such as by mask setup module 104. The operation of mask setup module 104 to create mask pairs 106 may be illustrated fully or in part by method 800.

At 802, a total number of values, such as addresses, to be filtered may be determined. At 804, the values may be sorted and a starting value, such as an address, of the values to be filtered may be determined. The sorting may be performed in ascending order.

At 806, it may be determined whether the number of addresses remaining is equal to one. If so, method 800 may proceed to 820. If not, then method 800 may proceed to 810. A single address may be masked with a requirement that an input match all values of the address, and thus requires no wildcards.

At 810, it may be determined whether the presently considered base address may be part of a mask pair to cover the address and one or more subsequent addresses. The determination may be made in any suitable manner. For example, an XOR operation may be performed between the presently considered base address and the next address to be filtered as determined and sorted in 802 and 804. The XOR operation may be applied or evaluated in bitwise fashion. If the presently considered base address is only one bit different than the next address, then the result may include a single "one" bit. If the presently considered base address is more than one bit different from the next address, then the result may include a plurality of "one" bits.

Thus, in 815, it may be determined whether the number of differing bits between the presently considered base address and the next address is equal to one, or greater than one. Such a determination may be performed by determining the number of "one" bits in the result of the XOR operation. If the number of differing bits (or the number of "one" bits in the result of the XOR operation) is greater than one, method 800 may proceed to 820. If the number of differing bits (or the number of "one" bits in the result of the XOR operation) is equal to one, method 800 may proceed to 835.

In 820, it may have been determined that the presently considered base address is a single address may be matched by a mask pair. Such a determination may result from, for example: determining in 806 that the presently considered base address is the last address for which a mask pair will be created; determining in 810 and 815 that the procedure for determining a resulting mask pair may not yield additional addresses; or determining in 810 and 815 that the presently considered base address is different from its subsequent address in more than one bit value, and thus a resulting mask pair may not yield additional addresses. In 825, a mask pair may be created for the presently considered base address requiring an input to match all elements of the address. For example, a mask field may be created for whose bits all "ones" (or for whose hexadecimal values all "F's") are assigned, or otherwise designated as requiring an input to exactly match the presently considered base address. A value field may be created and set to the presently considered base address. In 830, the total number of addresses left for which a mask pair is to be generated may be decremented. Furthermore, the presently considered base address may change to the next address in the order determined in 804. Method 800 may proceed to 885.

In 835, it may have been determined that the presently considered base address is a base address of a plurality of addresses that may be matched by a mask pair. The starting position for determining the wildcards of such a mask pair may be evaluated by reference to the result of the XOR operation of 810. The single "one" value in the result, designated for this discussion as positive bit b, may indicate a starting bit position for a determination of wildcards for the mask pair to be generated.

In 840, it may be determined how many sequential addresses (considering only the values starting at positive bit b) may be encompassed by a single mask pair including and beginning at the presently considered base address. Such a determination may be made in any suitable manner, such as by conducting 845-865.

In 845, a counter may be initialized as the value one. This value may be selected because, given the determinations in 810 and 815, it is known that a mask pair may include at least the presently considered base address and one additional, subsequent address (which, after discarding or ignoring all bits below b, may be sequentially ordered). The counter may be used, as discussed below, to determine how many addresses sequentially numbered (when all bits below b are ignored) from the presently considered base address that can still be encompassed by a single mask pair including the presently considered base address.

In 850, it may be determined whether an address subsequent to the presently considered base address is sequentially numbered (ignoring all bits below b). Such a determination may be made in any suitable manner. For example, first, the binary value of the counter is shifted left by b bits. Then, the shifted value of the counter is added to the currently considered base address. Then, it is determined if this sum, representing the expected address if numbers are sequentially numbered starting at b, is equal to the actual address in the equivalent position among the address values. Such an actual address may be specified by, for example, the address at an index position, wherein the index position includes sum of the index position of the presently considered base address and the counter. Such a comparison may be specified by, for example:

$$(counter<<b) + address_{Current} = address_{Current\_index + counter}?$$

If the expected address equals the actual address, then in 855 the counter may be incremented and 850 may be repeated. If not, method 800 may proceed to 860. Furthermore, if no more addresses are available, method 800 may proceed to 860. Determining if more addresses are available may be performed by, for example, evaluating the sum of the index of the currently considered base address plus the counter. If the sum is greater than the total number of addresses as determined above, then no more addresses may be available. In another example, a check may be performed such that, given a total number of addresses x and wherein evaluations of the addresses begin at $address_0$, the address at $address_x$ will not be evaluated because such an address would exceed the number of addresses available.

In 860, the counter may represent the number of sequentially numbered addresses (ignoring all bits below b) beginning at the presently considered base address. However, creation of a mask pair based on the counter wherein the counter is not an even number, such as three, may be impossible as the wildcards in a mask must be continuous. Furthermore, creation of a mask pair based on the counter wherein the counter is equal to some even numbers, such as six (binary 110), may not be possible as the wildcards in a mask must be continuous. In other words, the counter value is not the mask. Consequently, the counter may be reduced to a number for which a mask pair may be generated that would match addresses to be filtered—and only addresses to be filtered. Such a number may include the next lowest number n to the counter value which is a power of two. Thus, the counter may be reduced until a whole number n is reached for which ($2^n$=counter).

In 865, it may be determined that the counter is now the number of addresses that can be matched with a single mask pair starting at bit position b of the presently considered base address. At 870, the presently considered base address may be set as the value field of such a mask pair. At 875, the mask field of such a mask pair may be set so as, starting at bit position b, to ignore the next n bits (covering the number of addresses equal to the counter) and to require matches for all other bits. Such a mask field may be set by, for example, decrementing the counter (to frame it in terms of bit positions starting at zero), shifting the decremented counter to the left by b bits, negating the shifted counter, and performing an AND operation on the negated counter with a full set of binary "ones" or hexadecimal "F's". In another example, the mask field may initially be set as all binary "ones" or hexadecimal "F's", and wildcards (or "zeroes" or other indications that the bit is to be ignored) assigned to the n bits starting at bit position b.

In 880, the number of addresses for which mask pairs must be created may be reduced by the value of the counter.

In 885, it may be determined whether any addresses remain for which mask pairs must be created. If not, method 800 may terminate. If so, method 800 may return to 806.

Method 800 may be implemented using the system of FIGS. 1-5, or any other system or mechanism to implement method 600. As such, the preferred initialization point for method 800 and the order of the elements comprising method 800 may depend on the implementation chosen. In some embodiments, some portions of method 800 may be optionally omitted, repeated, or combined. In certain embodiments, method 600 may be implemented partially or fully in software embodied in computer-readable media.

In one example, method 800 may be applied to the set of values to be filtered that includes the hexadecimal and binary values of:

00F0<hexadecimal>=0000 0000 1111 0000<binary>
10F0<hexadecimal>=0001 0000 1111 0000<binary>
20F0<hexadecimal>=0010 0000 1111 0000<binary>
30F0<hexadecimal>=0011 0000 1111 0000<binary>
40F0<hexadecimal>=0100 0000 1111 0000<binary>
70F0<hexadecimal>=0111 0000 1111 0000<binary>

Thus, application of method 800 may result in a single mask pair for the values {00F0, 10F0, 20F0, 30F0} for the bits as indicated above. Because a single mask pair may not exist that would also cover the value 40F0—and not any additional values not appearing in the values to be filtered—a separate mask pair may be generated for the values 40F0 and 70F0.

During generation of the mask pair for the values {00F0, 10F0, 20F0, 30F0}, it may be determined that the number of leading bits for which 00F0 and 10F0 have in common is twelve (corresponding to the bits for 0F0). Thus, b is equal to twelve. The counter value may indicate by the fifth execution of 850 that there are five sequentially ordered values—{00F0 10F0 20F0 30F0 40F0}—beginning at the base address of 00F0 when the first eight bits (equal to F0) are ignored. The counter may have stopped incrementing in the following way. The counter (five=0101 (binary)) was shifted to left twelve bits (resulting in 0101 0000 0000 0000), then added to the address of the current location (resulting in 0101 0000 1111 0000). The actual address was the address at the position with the index of the sum of the current base address index and the counter (0+5=5). The actual address at the position index of five is the hexadecimal value 70F0 (in binary, 0111 0000 1111 0000) which is not equal to the above determined expected address (0101 0000 1111 0000). Accordingly, it may be determined that the value 70F0 is not sequentially ordered with respect to the addresses beginning at b, or bit position twelve.

Furthermore, it may be determined that the counter (5) may be reduced until it is a power of two, representing the number of addresses that may be covered by a single mask pair and eliminating overinclusive coverage. Thus, the counter may be reduced until the counter is equal to four ($2^n$=counter wherein n=2). Thus, a mask pair may be created wherein all bits of the base value, 00F0, are required except the two (n=2) bits beginning at bit position b (b=12). Such a base value may include 00F0 (or 0000 0000 1111 0000) and a resulting mask value may include CFFF (or 1100 1111 1111 1111). The process of determining mask pairs may be repeated to determining mask pairs for each of the addresses 40F0 and 70F0.

Methods 600 and 800 may be implemented using the system of FIGS. 1-5 and 7, or any other system or mechanism to implement methods 600 and 800. As such, the preferred initialization point for methods 600 and 800 and the order of the elements comprising methods 600 and 800 may depend on the implementation chosen. In some embodiments, some portions of methods 600 and 800 may be optionally omitted, repeated, or combined. In certain embodiments, methods 600 and 800 may be implemented partially or fully in software embodied in computer-readable media.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk (CD), random access memory (RAM), read-only memory (ROM), CD-ROM, digital versatile disc (DVD), electrically erasable programmable read-only memory (EEPROM), and/or flash memory; non-transitory media; and/or any combination of the foregoing.

Although the present disclosure and its advantages have been described in detail, it should be understood that various changes, substitutions and alterations can be made herein without departing from the spirit and scope of the disclosure as defined by the following claims.

What is claimed is:

1. A method comprising:
    determining a plurality of addresses, each address associated with a port of a network device and including an address width and a plurality of positions, each position including a numerical component, the address width equal to a total number of positions;
    determining a plurality of masks, each mask configured to match one or more addresses and including:
        a mask width equal to the address width; and
        matching criteria for determining whether a given one of the addresses is to be filtered, the matching criteria including, for each of the positions:
            a matching component specifying that an identified position in the address includes a particular value; or
            a wildcard component specifying that an identified position in the address is to be ignored; and
    storing the masks in a ternary content-addressable-memory (TCAM) for matching a candidate address to the masks to determine whether the candidate address matches any of the addresses;
    wherein:
        the masks include at least one mask with a wildcard component;
        a total number of masks is less than a total number of the addresses; and
        a total number of possible addresses corresponding to the masks is equal to a total number of the addresses.

2. The method of claim 1, wherein the ports include a virtual port.

3. The method of claim 1, wherein the addresses include non-sequentially numbered addresses.

4. The method of claim 1, wherein determining the plurality of masks includes:
    designating the addresses as unmatched addresses;
    determining a lowest address as a candidate unmatched address;
    determining the number of leading zeroes in the candidate unmatched address and setting the number of leading zeroes as a counter;
    reducing the counter until a total number of unmatched addresses is equal to a total number of addresses addressable by a number of wildcards, the number of wildcards equal to the counter;
    assigning wildcard components to a number of least significant bits of a new mask, the number of least significant bits equal to the counter; and
    assigning matching components for all other bits of the new mask; and
    adding the new mask to the plurality of masks.

5. The method of claim 1, wherein determining the plurality of masks includes:
    ordering the addresses by address value and designating the addresses as unmatched addresses;
    determining a lowest address as a candidate unmatched address;
    determining the number of leading zeroes in the candidate unmatched address and setting the number of leading zeroes as a counter;
    reducing the counter until a total number of unmatched addresses is equal to a total number of addresses addressable by a number of wildcards, the number of wildcards equal to the counter;
    determining that the counter is zero;
    based upon the determination the counter is zero, assigning matching components for all bits of a new mask; and
    adding the new mask to the plurality of masks.

6. The method of claim 1, wherein determining the plurality of masks includes:
    ordering the addresses by address value and designating the addresses as unmatched addresses;
    determining a lowest address as a candidate unmatched address;
    performing bitwise comparison between the candidate unmatched address and the next-lowest-address;
    determining that the candidate unmatched address and the next-lowest address differ by one bit at a differing position;

determining a number of sequential addresses in the unmatched addresses considering only the most significant bits beginning at the differing position in the candidate unmatched address;

reducing the number of sequential addresses in the unmatched addresses until the number of sequential addresses is equal to a total number of addresses addressable by a number of wildcards;

assigning wildcard components to a number of least significant bits at a start position of a new mask, the start position equal to the differing position;

assigning matching components for all other bits of the new mask; and adding the new mask to the plurality of masks.

7. The method of claim 1, wherein determining the plurality of masks includes:

ordering the addresses by address value and designating the addresses as unmatched addresses;

determining a lowest address as a candidate unmatched address;

performing bitwise comparison between the candidate unmatched address and the next-lowest-address;

determining that the candidate unmatched address and the next-lowest address differ by more than one bit;

assigning matching components for all bits of a new mask; and adding the new mask to the plurality of masks.

8. An article of manufacture comprising:

a non-transitory computer readable medium; and computer-executable instructions carried on the computer readable medium, the instructions readable by a processor, the instructions, when read and executed, for causing the processor to:

determine a plurality of addresses, each address associated with a port of a network device and including an address width and a plurality of positions, each position including a numerical component, the address width equal to a total number of positions;

determine a plurality of masks, each mask configured to match one or more addresses and including:

a mask width equal to the address width; and matching criteria for determining whether a given one of the addresses is to be filtered, the matching criteria including, for each of the positions:

a matching component specifying that an identified position in the address includes a particular value; or a wildcard component specifying that an identified position in the address is to be ignored; and store the masks in a ternary content-addressable-memory (TCAM) for matching a candidate address to the masks to determine whether the candidate address matches any of the addresses;

wherein:

the masks include at least one mask with a wildcard component;

a total number of masks is less than a total number of the addresses; and a total number of possible addresses corresponding to the masks is equal to a total number of the addresses.

9. The article of claim 8, wherein the ports include a virtual port.

10. The article of claim 8, wherein the addresses include non-sequentially numbered addresses.

11. The article of claim 8, wherein determining the plurality of masks includes:

ordering the addresses by address value and designating the addresses as unmatched addresses;

determining a lowest address as a candidate unmatched address;

determining the number of leading zeroes in the candidate unmatched address and setting the number of leading zeroes as a counter;

reducing the counter until a total number of unmatched addresses is equal to a total number of addresses addressable by a number of wildcards, the number of wildcards equal to the counter;

assigning wildcard components to a number of least significant bits of a new mask, the number of least significant bits equal to the counter; and assigning matching components for all other bits of the new mask; and adding the new mask to the plurality of masks.

12. The article of claim 8, wherein determining the plurality of masks includes:

ordering the addresses by address value and designating the addresses as unmatched addresses;

determining a lowest address as a candidate unmatched address;

determining the number of leading zeroes in the candidate unmatched address and setting the number of leading zeroes as a counter;

reducing the counter until a total number of unmatched addresses is equal to a total number of addresses addressable by a number of wildcards, the number of wildcards equal to the counter;

determining that the counter is zero;

based upon the determination the counter is zero, assigning matching components for all bits of a new mask; and adding the new mask to the plurality of masks.

13. The article of claim 8, wherein determining the plurality of masks includes:

ordering the addresses by address value and designating the addresses as unmatched addresses;

determining a lowest address as a candidate unmatched address;

performing bitwise comparison between the candidate unmatched address and the next-lowest-address;

determining that the candidate unmatched address and the next-lowest address differ by one bit at a differing position;

determining a number of sequential addresses in the unmatched addresses considering only the most significant bits beginning at the differing position in the candidate unmatched address;

reducing the number of sequential addresses in the unmatched addresses until the number of sequential addresses is equal to a total number of addresses addressable by a number of wildcards;

assigning wildcard components to a number of least significant bits at a start position of a new mask, the start position equal to the differing position;

assigning matching components for all other bits of the new mask; and adding the new mask to the plurality of masks.

14. The article of claim 8, wherein determining the plurality of masks includes:

ordering the addresses by address value and designating the addresses as unmatched addresses;

determining a lowest address as a candidate unmatched address;

performing bitwise comparison between the candidate unmatched address and the next-lowest-address;
determining that the candidate unmatched address and the next-lowest address differ by more than one bit;
assigning matching components for all bits of a new mask; and
adding the new mask to the plurality of masks.

15. An electronic device, comprising:
a processor;
a computer readable medium; and
computer-executable instructions carried on the computer readable medium, the instructions readable by the processor, the instructions, when read and executed, for causing the processor to:
  determine a plurality of addresses, each address associated with a port of a network device and including an address width and a plurality of positions, each position including a numerical component, the address width equal to a total number of positions;
  determine a plurality of masks, each mask configured to match one or more addresses and including:
    a mask width equal to the address width; and
    matching criteria for determining whether a given one of the addresses is to be filtered, the matching criteria including, for each of the positions:
      a matching component specifying that an identified position in the address includes a particular value; or
      a wildcard component specifying that an identified position in the address is to be ignored; and
  store the masks in a ternary content-addressable-memory (TCAM) for matching a candidate address to the masks to determine whether the candidate address matches any of the addresses;
wherein:
  the masks include at least one mask with a wildcard component;
  a total number of masks is less than a total number of the addresses; and
  a total number of possible addresses corresponding to the masks is equal to a total number of the addresses.

16. The electronic device of claim 15, wherein the addresses include non-sequentially numbered addresses.

17. The electronic device of claim 15, wherein determining the plurality of masks includes:
  ordering the addresses by address value and designating the addresses as unmatched addresses;
  determining a lowest address as a candidate unmatched address;
  determining the number of leading zeroes in the candidate unmatched address and setting the number of leading zeroes as a counter;
  reducing the counter until a total number of unmatched addresses is equal to a total number of addresses addressable by a number of wildcards, the number of wildcards equal to the counter;
  assigning wildcard components to a number of least significant bits of a new mask, the number of least significant bits equal to the counter; and
  assigning matching components for all other bits of the new mask; and
  adding the new mask to the plurality of masks.

18. The electronic device of claim 15, wherein determining the plurality of masks includes:
  ordering the addresses by address value and designating the addresses as unmatched addresses;
  determining a lowest address as a candidate unmatched address;
  determining the number of leading zeroes in the candidate unmatched address and setting the number of leading zeroes as a counter;
  reducing the counter until a total number of unmatched addresses is equal to a total number of addresses addressable by a number of wildcards, the number of wildcards equal to the counter;
  determining that the counter is zero;
  based upon the determination the counter is zero, assigning matching components for all bits of a new mask; and
  adding the new mask to the plurality of masks.

19. The electronic device of claim 15, wherein determining the plurality of masks includes:
  ordering the addresses by address value and designating the addresses as unmatched addresses;
  determining a lowest address as a candidate unmatched address;
  performing bitwise comparison between the candidate unmatched address and the next-lowest-address;
  determining that the candidate unmatched address and the next-lowest address differ by one bit at a differing position;
  determining a number of sequential addresses in the unmatched addresses considering only the most significant bits beginning at the differing position in the candidate unmatched address;
  reducing the number of sequential addresses in the unmatched addresses until the number of sequential addresses is equal to a total number of addresses addressable by a number of wildcards;
  assigning wildcard components to a number of least significant bits at a start position of a new mask, the start position equal to the differing position;
  assigning matching components for all other bits of the new mask; and
  adding the new mask to the plurality of masks.

20. The electronic device of claim 15, wherein determining the plurality of masks includes:
  ordering the addresses by address value and designating the addresses as unmatched addresses;
  determining a lowest address as a candidate unmatched address;
  performing bitwise comparison between the candidate unmatched address and the next-lowest-address;
  determining that the candidate unmatched address and the next-lowest address differ by more than one bit;
  assigning matching components for all bits of a new mask; and
  adding the new mask to the plurality of masks.

* * * * *